US010134350B2

(12) United States Patent
Su

(10) Patent No.: US 10,134,350 B2
(45) Date of Patent: Nov. 20, 2018

(54) SHIFT REGISTER UNIT, METHOD FOR DRIVING SAME, GATE DRIVING CIRCUIT AND DISPLAY APPARATUS

(71) Applicants: BOE Technology Group Co., Ltd., Beijing (CN); Beijing BOE Display Technology Co., Ltd., Beijing (CN)

(72) Inventor: Qiujie Su, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/652,493

(22) Filed: Jul. 18, 2017

(65) Prior Publication Data
US 2018/0047356 A1 Feb. 15, 2018

(30) Foreign Application Priority Data

Aug. 9, 2016 (CN) .......................... 2016 1 0644850

(51) Int. Cl.
G09G 3/36 (2006.01)
G11C 19/28 (2006.01)

(52) U.S. Cl.
CPC ......... *G09G 3/3648* (2013.01); *G09G 3/3677* (2013.01); *G11C 19/28* (2013.01); *G11C 19/287* (2013.01); *G09G 3/3614* (2013.01); *G09G 2300/0408* (2013.01); *G09G 2310/0251* (2013.01); *G09G 2310/0286* (2013.01); *G09G 2310/061* (2013.01)

(58) Field of Classification Search
CPC ................ A61H 15/0085; A61H 7/007; A61H 15/0092; A61H 2201/10; A61H 2015/005; A61H 2007/009
See application file for complete search history.

(56) References Cited

U.S. PATENT DOCUMENTS 5,648,793 A * 7/1997 Chen ..................... G09G 3/3614
345/209
7,038,673 B2 * 5/2006 Lee ....................... G09G 3/3677
345/211
(Continued)

*Primary Examiner* — Jose Soto Lopez
(74) *Attorney, Agent, or Firm* — Westman, Champlin & Koehler, P.A.

(57) ABSTRACT

The embodiments of the present disclosure provide a shift register unit, a method for driving the shift register unit, a gate driving circuit and a display apparatus. The shift register unit comprises a first input module, a first output module, a first reset module, a first storage module and a second reset module. The first input module is configured to output a first pull-up signal to the first output module based on a first input signal. The first output module is configured to output an output signal based on the first pull-up signal and a first clock signal. The first storage module is configured to store the first pull-up signal. The first reset module is configured to reset the first storage module based on a first reset signal. The second reset module is configured to reset the output from the first output module based on a second reset signal. The second reset signal is set to be valid while the first pull-up signal and the first clock signal are valid and a duration in which the second reset signal is valid is shorter than a duration in which the first clock signal is valid.

20 Claims, 15 Drawing Sheets

(56) References Cited

U.S. PATENT DOCUMENTS

| | | | | |
|---|---|---|---|---|
| 7,561,138 B2* | 7/2009 | Byun | .................... | G09G 3/3677 |
| | | | | 345/87 |
| 8,089,447 B2* | 1/2012 | Song | .................... | G09G 3/3614 |
| | | | | 345/100 |
| 9,786,243 B2* | 10/2017 | Cho | ...................... | G09G 3/3677 |
| 2002/0075212 A1* | 6/2002 | Song | .................... | G09G 3/3614 |
| | | | | 345/87 |
| 2003/0122765 A1* | 7/2003 | Yoon | .................... | G09G 3/3674 |
| | | | | 345/94 |
| 2006/0119559 A1* | 6/2006 | Jung | .................... | G09G 3/3614 |
| | | | | 345/96 |
| 2007/0038909 A1* | 2/2007 | Kim | ...................... | G09G 3/3677 |
| | | | | 714/726 |
| 2007/0268231 A1* | 11/2007 | Kang | .................. | G09G 3/3648 |
| | | | | 345/100 |
| 2010/0315403 A1* | 12/2010 | Kaneyoshi | ........... | G09G 3/3614 |
| | | | | 345/211 |
| 2015/0318052 A1* | 11/2015 | Li | .......................... | G11C 19/28 |
| | | | | 377/64 |
| 2017/0178584 A1* | 6/2017 | Ma | ....................... | G09G 3/3677 |
| 2017/0199617 A1* | 7/2017 | Gu | ........................ | G06F 3/0416 |
| 2017/0316731 A1* | 11/2017 | Cho | ..................... | G09G 3/2092 |

* cited by examiner

SHIFT REGISTER UNIT, METHOD FOR DRIVING SAME, GATE DRIVING CIRCUIT AND DISPLAY APPARATUS

CROSS REFERENCE TO RELATED APPLICATIONS

The present disclosure claims a benefit from Chinese Patent Application No. 201610644850.4, titled "SHIFT REGISTER UNIT, METHOD FOR DRIVING SAME, GATE DRIVING CIRCUIT AND DISPLAY APPARATUS" and filed on Aug. 9, 2016, which is incorporated here by reference in its entirety.

TECHNICAL FIELD

The present disclosure relates to display technology, and more particularly, to a shift register unit, a method for driving the shift register unit, a gate driving circuit and a display apparatus.

BACKGROUND

Liquid Crystal Display (LCD) panels having low power consumption, low cost and high resolution are one of hot topics in display technology. With Gate Driver on Array (GOA) technique, a gate driving chip can be replaced with a gate driving circuit integrated on an array substrate, so as to reduce power consumption and cost. Moreover, in a GOA circuit, a pre-charging technique can be applied to further reduce the power consumption and shorten refreshing time, so as to achieve high resolution. However, the pre-charging technique may increase the power consumption and degrade charging efficiency of a pixel circuit if it does not match the inversion scheme used for the LCD panel.

There is thus a need for an improved pre-charging technique.

SUMMARY

Embodiments of the present disclosure provide a shift register unit, a method for driving the shift register unit, a gate driving circuit and a display apparatus.

According to a first aspect of the present disclosure, a shift register unit is provided. The shift register unit comprises: a first input module connected to a first input signal terminal and a first output module and configured to output a first pull-up signal to the first output module based on a first input signal; the first output module connected to a first clock signal terminal and configured to output an output signal based on the first pull-up signal and a first clock signal; a first storage module connected to the first input module and the first output module and configured to store the first pull-up signal; a first reset module connected to a first reset signal terminal and the first storage module and configured to reset the first storage module based on a first reset signal; and a second reset module connected to a second reset signal terminal and the first output module and configured to reset the output from the first output module based on a second reset signal. The second reset signal is set to be valid while the first pull-up signal and the first clock signal are valid and a duration in which the second reset signal is valid is shorter than a duration in which the first clock signal is valid.

In an embodiment of the present disclosure, the second reset module comprises a fifth transistor having a first electrode connected to a reset voltage terminal, a second electrode connected to an output terminal of the first output module, and a control electrode connected to the second reset signal terminal.

In an embodiment of the present disclosure, the shift register unit further comprises a second reset signal generation module. The second reset signal terminal is connected to the second reset signal generation module. The second reset signal generation module comprises: a second input module connected to a second input signal terminal and a second output module and configured to output a second pull-up signal to the second output module based on a second input signal; the second output module connected to a second clock signal terminal and the second reset signal terminal and configured to output a second reset signal based on the second pull-up signal and a second clock signal; a second storage module connected to the second input module and the second output module and configured to store the second pull-up signal; a third reset module connected to a third reset signal terminal and the second storage module and configured to reset the second storage module based on a third reset signal; and a fourth reset module connected to a fourth reset signal terminal and the second output module and configured to reset the output from the second output module based on a fourth reset signal.

In an embodiment of the present disclosure, the third reset signal terminal is connected to the fourth reset signal terminal.

In an embodiment of the present disclosure, the second reset module further comprises a fourth transistor having a first electrode connected to the reset voltage terminal, a second electrode connected to the output terminal of the first output module, and a control electrode connected to the first reset signal terminal.

In an embodiment of the present disclosure, the first input module comprises a first transistor having a control electrode and a first electrode connected to the first input signal terminal and a second electrode connected to the first output module. The first output module comprises a second transistor having a control electrode connected to the first input module, a first electrode connected to the first clock signal terminal and a second electrode connected to an output terminal of the first output terminal. The first storage module comprises a first capacitor having a first terminal connected to the control electrode of the second transistor and a second terminal connected to the second electrode of the second transistor. The first reset module comprises a third transistor having a control electrode connected to the first reset signal terminal, a first electrode connected to a reset voltage terminal and a second electrode connected to the first terminal of the first capacitor.

In an embodiment of the present disclosure, the second input module comprises a sixth transistor having a control electrode and a first electrode connected to the second input signal terminal and a second electrode connected to the second output module. The second output module comprises a seventh transistor having a control electrode connected to the second input module, a first electrode connected to the second clock signal terminal and a second electrode connected to the second reset signal terminal. The second storage module comprises a second capacitor having a first terminal connected to the control electrode of the seventh transistor and a second terminal connected to the second electrode of the seventh transistor. The third reset module comprises an eighth transistor having a control electrode connected to the third reset signal terminal, a first electrode connected to the reset voltage terminal and a second electrode connected to the first terminal of the second capacitor.

The fourth reset module comprises a ninth transistor having a control electrode connected to the fourth reset signal terminal, a first electrode connected to the reset voltage terminal and a second electrode connected to the second terminal of the second capacitor.

According to a second aspect of the present disclosure, a gate driving circuit is provided. The gate driving circuit comprises a plurality of cascaded shift register units according to the above first aspect. The gate driving circuit comprises M first clock signal lines each connected to the first clock signal terminal of one of a group of M cascaded shift register units. The first clock signals on the M first clock signal lines are the same, with a difference of 1/M period in time from one another sequentially. The first input signal terminal of the shift register unit at the N-th stage is connected to the output terminal of the first output module of the shift register unit at the (N−X)-th stage. The first reset signal terminal of the shift register unit at the N-th stage is connected to the output terminal of the first output module of the shift register unit at the (N+Y)-th stage. Here, X=Y=M/2 and X, Y and M are all positive integers.

In an embodiment of the present disclosure, each second reset module comprises a fifth transistor having a first electrode connected to a reset voltage terminal, a second electrode connected to the output terminal of the first output module, and a control electrode connected to the second reset signal terminal.

In an embodiment of the present disclosure, the second reset signal terminal of the shift register unit at the N-th stage is connected to the output terminal of the first output module of the shift register unit at the (N+Z)-th stage.

In an embodiment of the present disclosure, M=6, X=3, Y=3 and Z=1.

In an embodiment of the present disclosure, each shift register unit further comprises a second reset signal generation module. The second reset signal generation module comprises: a second input module connected to a second input signal terminal and a second output module and configured to output a second pull-up signal to the second output module based on a second input signal; the second output module connected to a second clock signal terminal and the second reset signal terminal and configured to output a second reset signal based on the second pull-up signal and a second clock signal; a second storage module connected to the second input module and the second output module and configured to store the second pull-up signal; a third reset module connected to a third reset signal terminal and the second storage module and configured to reset the second storage module based on a third reset signal; and a fourth reset module connected to a fourth reset signal terminal and the second output module and configured to reset the output from the second output module based on a fourth reset signal. The gate driving circuit further comprises M' second clock signal lines each connected to the second clock signal terminal of one of a group of M' cascaded second reset signal generation modules, the second clock signals on the M' second clock signal lines are the same, with a difference of 1/M' period in time from one another sequentially, the second input signal terminal of the second reset signal generation module at the N-th stage is connected to the output terminal of the second output module of the second reset signal generation module at the (N−X')-th stage, the third reset signal terminal of the second reset signal generation module at the N-th stage is connected to the output terminal of the second output module of the second reset signal generation module at the (N+Y')-th stage, and the fourth reset signal terminal of the second reset signal generation module at the N-th stage is connected to the output terminal of the second output module of the second reset signal generation module at the (N+Z')-th stage.

In an embodiment of the present disclosure, M=6, X=3, Y=3, M'=2, X'=1, Y'=1 and Z'=1. The second clock signal on each of the M' second clock signal lines has a frequency triple that of the first clock signal on each of the M first clock signal lines.

According to a third aspect of the present disclosure, a method for driving the shift register unit according to the above first aspect is provided. The method comprises: an input phase in which the first clock signal is invalid, the first input signal is valid and the first reset signal is invalid, such that the first input signal is stored in the first storage module; an output phase in which the first clock signal is valid, the first input signal is invalid, the first reset signal is invalid and the second reset signal is valid, a duration in which the second reset signal is valid being shorter than a duration in which the first clock signal is valid; and a reset phase in which the first clock signal is invalid, the first input signal is invalid and the first reset signal is valid, such that the output signal is invalid.

According to a fourth aspect of the present disclosure, an array substrate is provided. The array substrate comprises the gate driving circuit according to the above third aspect.

According to a fifth aspect of the present disclosure, a display apparatus is provided. The display apparatus comprises the array substrate according to the above fourth aspect.

With the shift register unit, the method for driving the shift register unit, the gate driving circuit and the display apparatus according to the embodiments of the present disclosure, the second reset module is configured to reset the output from the first output module based on the second reset signal, such that the output signal can be switched between valid and invalid in the output phase. In this way, the pre-charging process of the pixel circuit can match the inversion scheme used by the LCD panel, thereby achieving an improved charging efficiency.

BRIEF DESCRIPTION OF THE DRAWINGS

In order to illustrate the solutions according to the embodiments of the present disclosure clearly, the figures for description of the embodiments will be introduced briefly here. It is to be noted here that the figures described below only illustrate some embodiments of the present disclosure, rather than limiting the scope of the present disclosure.

DETAILED DESCRIPTION OF THE EMBODIMENTS

In the following, the solutions according to the embodiments of the present disclosure will be described clearly and fully with reference to the figures, such that these solutions can become more apparent to those skilled in the art. Obviously, the embodiments described below are only some, rather than all, of the embodiments. Starting from the embodiments of the present disclosure, those skilled in the art can obtain other embodiments without applying any inventive skills. All these embodiments are to be encompassed by the scope of the present disclosure.

Figure 1:
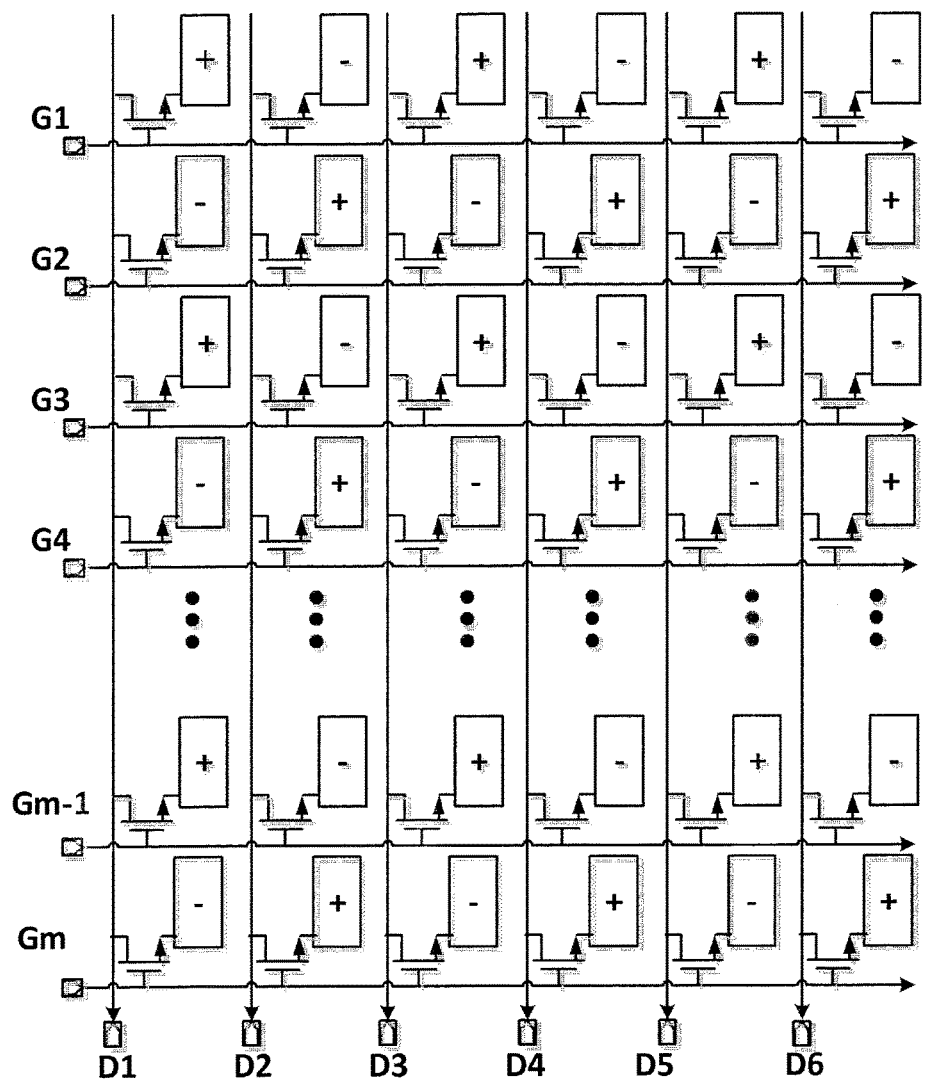
FIG. 1 is a schematic diagram showing pixels that are driven in a point-inversion scheme in a display apparatus.

FIG. 1 is a schematic diagram showing pixels that are driven in a point-inversion scheme in a display apparatus. As shown in FIG. 1, the display apparatus includes a plurality of pixel units in an m*n matrix. The pixel units are provided at respective intersections of m gate scan lines, G1, G2, . . . , Gm, and n data lines, D1, D2, . . . , Dn. In the point-inversion driving scheme, the polarities of data voltages applied to neighboring pixel units via the data lines will vary even within the time period during which one frame of image is displayed.

Figure 2:
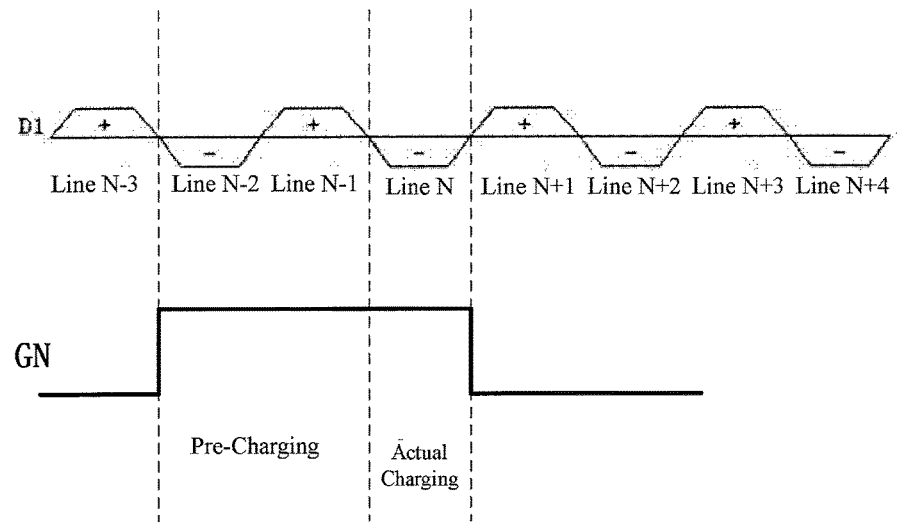
FIG. 2 is a schematic diagram showing a voltage variation on one of the data lines shown in FIG. 1.

FIG. 2 is a schematic diagram showing a voltage variation on one of the data lines shown in FIG. 1. As shown in FIG. 2, in the time period during which one frame of image is displayed, one data line transmits data voltages to a number of lines of pixel units sequentially. The data voltages for different lines of pixels units have different polarities and the voltage on the data line varies alternately over time.

In the example shown in FIG. 2, the pre-charging technique is used, such that when the pixel units in the (N−2)-th line are actually charged with the data voltage on the data line D1, a valid level is applied onto the gate scan line GN corresponding to the pixels in the N-th line. In this case, control transistors in the pixel units are turned on and the data voltage on the data line can also pre-charge the pixels in the N-th line. The data voltage for pre-charging the pixels in the N-th line has the same polarity as the data voltage required for actually charging the pixels in the N-th line, which leads to an improved charging efficiency. However, when the data voltage on the data line D1 is actually charging the pixel units in the (N−1)-th line, a valid level is still applied onto the gate scan line GN corresponding to the pixels in the N-th line. Then, the data voltage for pre-charging the pixels in the N-th line has an opposite polarity to the data voltage required for actually charging the pixels in the N-th line, which has an adverse impact on the actual charging and degrades the charging efficiency.

Figure 3:
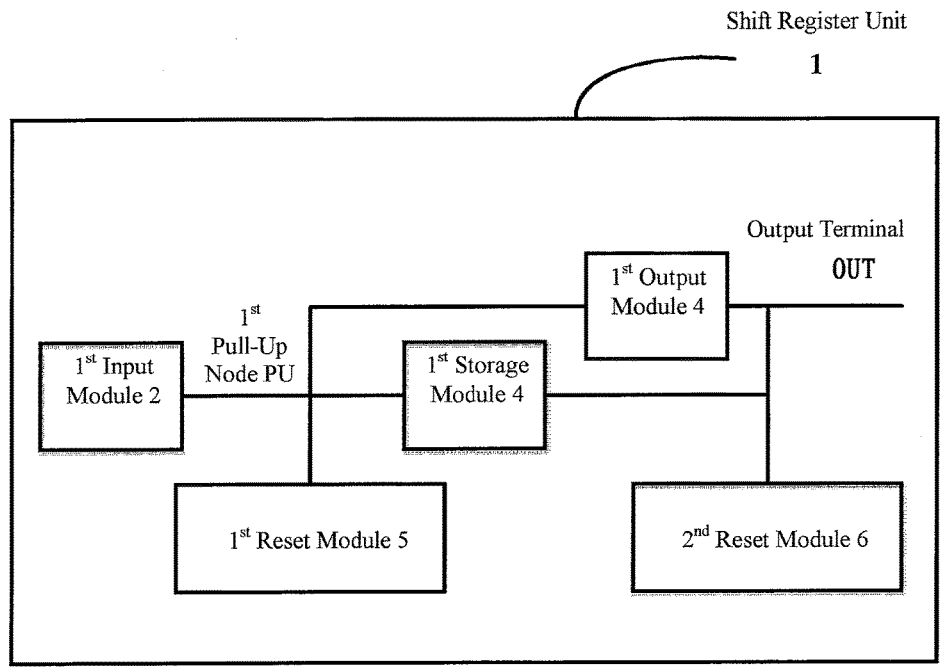
FIG. 3 is a block diagram of a shift register unit according to an embodiment of the present disclosure.

FIG. 3 is a block diagram of a shift register unit according to an embodiment of the present disclosure. The shift register unit 1 is used to drive the pixel units shown in FIG. 1. The shift register unit 1 includes a first input module 2 connected to a first input signal terminal and a first output module 3 and configured to output a first pull-up signal to the first output module 3 based on a first input signal. The shift register unit 1 further includes the first output module 3 connected to a first clock signal terminal and a gate scan line (one of G1, G2, . . . , Gn) for a corresponding pixel unit, and configured to output an output signal to the pixel unit via an output terminal, OUT, based on the first pull-up signal and a first clock signal. The shift register unit 1 further includes a first storage module 4 connected to the first input module 2 and the first output module 3 and configured to store the first pull-up signal. The shift register unit 1 further includes a first reset module 5 connected to a first reset signal terminal and the first storage module 4 and configured to reset the first storage module 4 based on a first reset signal. The shift register unit 1 further includes a second reset module 6 connected to a second reset signal terminal and the first output module 3 and configured to reset the output from the first output module 3 based on a second reset signal, such that the output signal can be switched between valid and invalid in an output phase.

Figure 4:
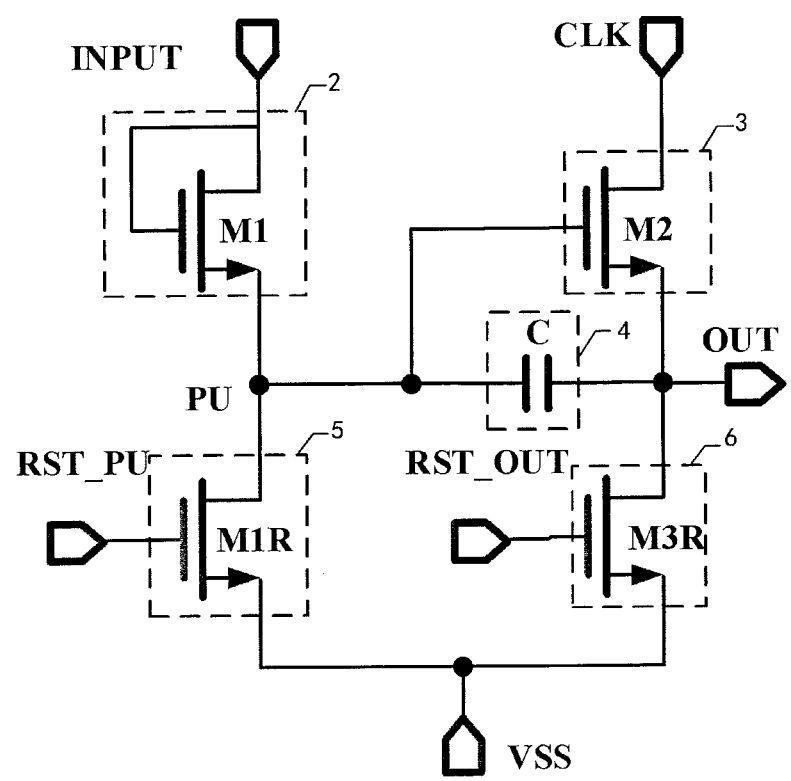
FIG. 4 is a circuit diagram of a shift register unit according to an embodiment of the present disclosure.

FIG. 4 is a circuit diagram of a shift register unit according to an embodiment of the present disclosure. As shown in FIG. 4, the first input module 2 includes a first transistor M1 having a control electrode and a first electrode connected to the first input signal terminal, INPUT, and a second electrode connected to the first output module 3 at a first pull-up node, PU. The first output module 3 includes a second transistor M2 having a control electrode connected to the first transistor M1 of the first input module 2, a first electrode connected to the first clock signal terminal, CLK, and a second electrode, which is the output terminal OUT, connected to the pixel unit. The first storage module 4 includes a first capacitor C having a first terminal connected to the control electrode of the second transistor M2 and a second terminal connected to the second electrode of the second transistor M2. the first reset module 5 includes a third transistor M1R having a control electrode connected to the first reset signal terminal, RST_PU, a first electrode connected to a reset voltage terminal, VSS, and a second electrode connected to the first terminal of the first capacitor C. The second reset module 6 includes a fifth transistor M3R having a first electrode connected to the reset voltage terminal VSS, a second electrode connected to the output terminal OUT of the first output module 3, and a control electrode connected to a second reset signal terminal, RST_OUT. In an embodiment of the present disclosure, the control electrode of a transistor is its gate, the first electrode is one of its source and drain, and the second electrode is the other of its source and drain.

Figure 5:
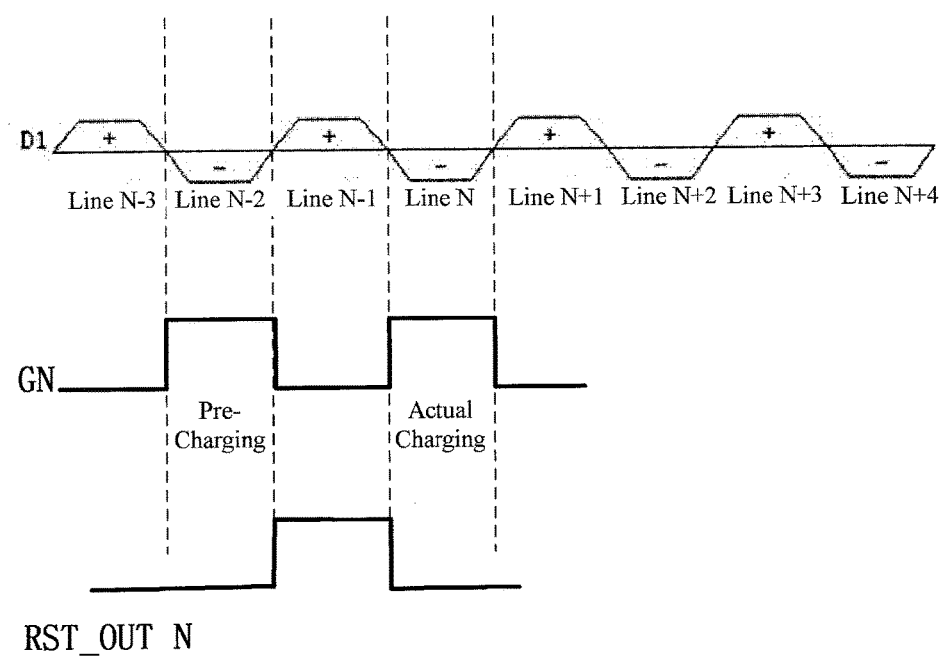
FIG. 5 is a schematic diagram showing a waveform of a signal outputted from the shift register unit shown in FIG. 4.

FIG. 5 is a schematic diagram showing a waveform of a signal outputted from the shift register unit shown in FIG. 4. As shown in FIG. 5, when the pixel units in the (N−2)-th line are actually charged with the data voltage on the data line D1, a valid level is applied onto the gate scan line GN corresponding to the pixels in the N-th line. In this case, control transistors in the pixel units are turned on and the data voltage on the data line can also pre-charge the pixels in the N-th line. The data voltage for pre-charging the pixels in the N-th line has the same polarity as the data voltage required for actually charging the pixels in the N-th line, which leads to an improved charging efficiency. Further, when the data voltage on the data line D1 is actually charging the pixel units in the (N−1)-th line, the second reset signal at the second reset signal terminal, RST_OUT N, of the shift register unit corresponding to the pixels in the N-th line is valid, such that an invalid level is applied onto the gate scan line GN corresponding to the pixels in the N-th line. At this time, the voltage having an opposite polarity to the data voltage for actual charging will not enter the pixel units, so as to guarantee the pre-charging efficiency.

Figure 6:
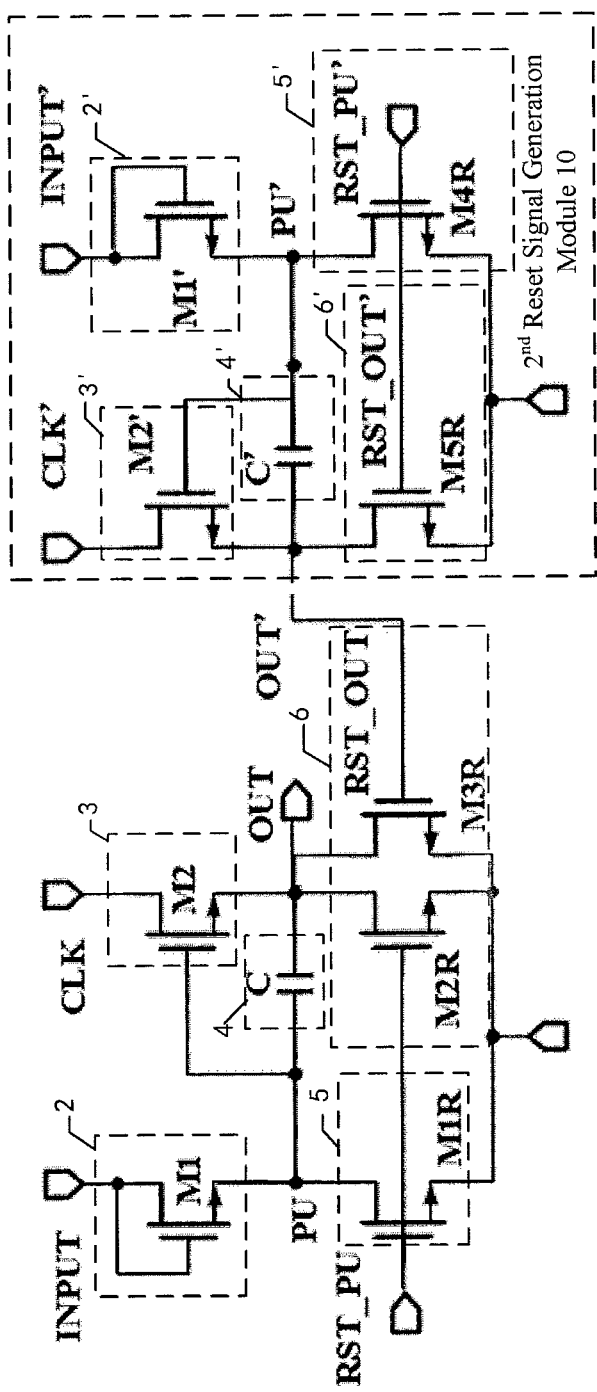
FIG. 6 is a circuit diagram of a shift register unit according to another embodiment of the present disclosure.

FIG. 6 is a circuit diagram of a shift register unit according to another embodiment of the present disclosure. As shown in FIG. 6, the second reset signal terminal RST_OUT is connected to a second reset signal generation module 10. The second reset signal generation module 10 includes a second input module 2' connected to a second input signal terminal, INPUT', and a second output module 3' and configured to output a second pull-up signal to the second output module 3' based on a second input signal. The second reset signal generation module 10 further includes the second output module 3' connected to a second clock signal terminal, CLK', and the second reset signal terminal RST_OUT and configured to output a second reset signal based on the second pull-up signal and a second clock signal. The second reset signal generation module 10 further includes a second storage module 4' connected to the second input module 2' and the second output module 3' and configured to store the second pull-up signal. The second reset signal generation module 10 further includes a third reset module 5' connected to a third reset signal terminal, RST_PU', and the second storage module 4' and configured to reset the second storage module 4' based on a third reset signal. The second reset signal generation module 10 further includes a fourth reset module 6' connected to a fourth reset signal terminal, RST_OUT', and the second output module 3' and configured to reset the output from the second output module 3' based on a fourth reset signal. The third reset signal terminal can be connected to the fourth reset signal terminal.

The second input module 2' includes a sixth transistor M1' having a control electrode and a first electrode connected to the second input signal terminal INPUT' and a second electrode connected to the second output module 3' at a second pull-up node, PU'. The second output module 3' includes a seventh transistor M2' having a control electrode connected to the second input module 2', a first electrode connected to the second clock signal terminal CLK' and a second electrode connected to the second reset signal terminal RST_OUT. The second storage module 4' includes a second capacitor C' having a first terminal connected to the control electrode of the seventh transistor M2' and a second terminal connected to the second electrode of the seventh transistor M2'. The third reset module 5' includes an eighth transistor M4R having a control electrode connected to the third reset signal terminal RST_PU', a first electrode connected to the reset voltage terminal VSS and a second electrode connected to the first terminal of the second capacitor C'. The fourth reset module 6' includes a ninth transistor M5R having a control electrode connected to the fourth reset signal terminal RST_OUT', a first electrode connected to the reset voltage terminal VSS and a second electrode connected to the second terminal of the second capacitor C'.

As shown in FIG. 6, the second reset signal terminal RST_OUT is connected to the second reset signal generation module 10, such that the second reset signal for the shift register unit at this stage can be provided by the second reset signal generation module 10.

The second reset module can further include a fourth transistor M2R having a first electrode connected to the reset voltage terminal VSS, a second electrode connected to the output terminal OUT of the first output module 3, and a control electrode connected to the first reset signal terminal RST_RU. In this way, the structure of the circuit formed by the first transistor M1, the second transistor M2, the capacitor C, the third transistor M1R and the fourth transistor M2R is identical to the structure of the second reset signal generation module 10 formed by the sixth transistor M1', the seventh transistor M2', the second capacitor C', the eighth transistor M4R and the ninth transistor M5R. Such circuit structures are easy to produce and arrange, which facilitates consistency in timing sequence of the signals.

Figure 7:
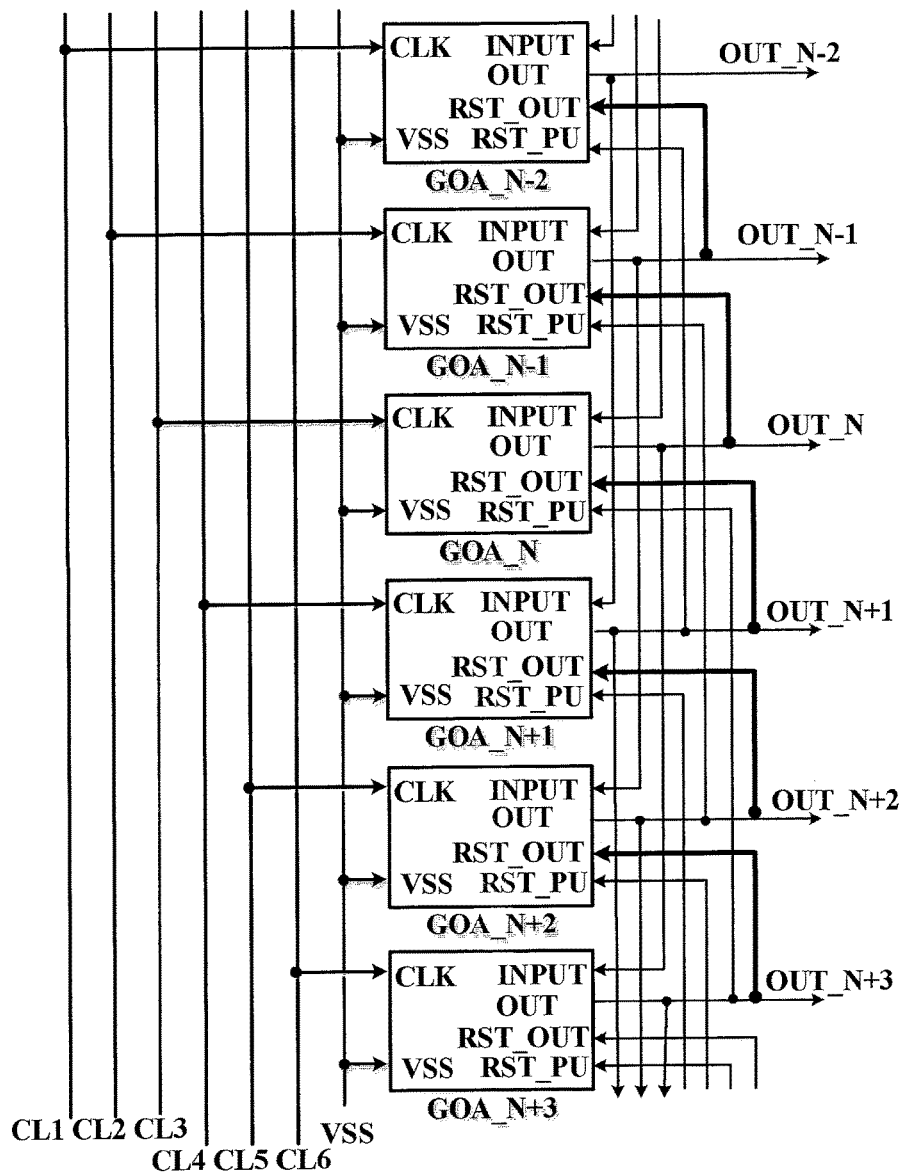
FIG. 7 is a schematic diagram of a gate driving circuit including the shift register unit shown in FIG. 4.

FIG. 7 is a schematic diagram of a gate driving circuit including the shift register unit shown in FIG. 4. As shown in FIG. 7, a gate driving circuit is provided according to an embodiment of the present disclosure. The gate driving circuit can include a plurality of cascaded shift register units 1 as shown in FIG. 4. Here, the gate driving circuit includes M first clock signal lines (CL1, CL2, CL3, CL4, CL5, CL6) each connected to the first clock signal terminal of one of a group of M cascaded shift register units 1 (GOA_N−2, GOA_N−1, GOA_N, GOA_N+1, GOA_N+2, GOA_N+3). The first clock signals at the M first clock signal lines are the same, with a difference of 1/M period in time from one another sequentially. The first input signal terminal INPUT of the shift register unit 1 at the N-th stage is connected to the output terminal OUT of the first output module of the shift register unit at the (N−X)-th stage. The first reset signal terminal RST_PU of the shift register unit at the N-th stage is connected to the output terminal OUT of the first output module of the shift register unit at the (N+Y)-th stage. The second reset signal terminal RST_OUT of the shift register unit at the N-th stage is connected to the output terminal OUT of the first output module of the shift register unit at the (N+Z)-th stage. Here, the values of M, X, Y and Z can be adjusted depending on the timing sequence of the signals as appropriate. In general, for the purpose of timing sequence control, X=Y=M/2, e.g., M=6, X=3, Y=3 and Z=1.

Figure 8:
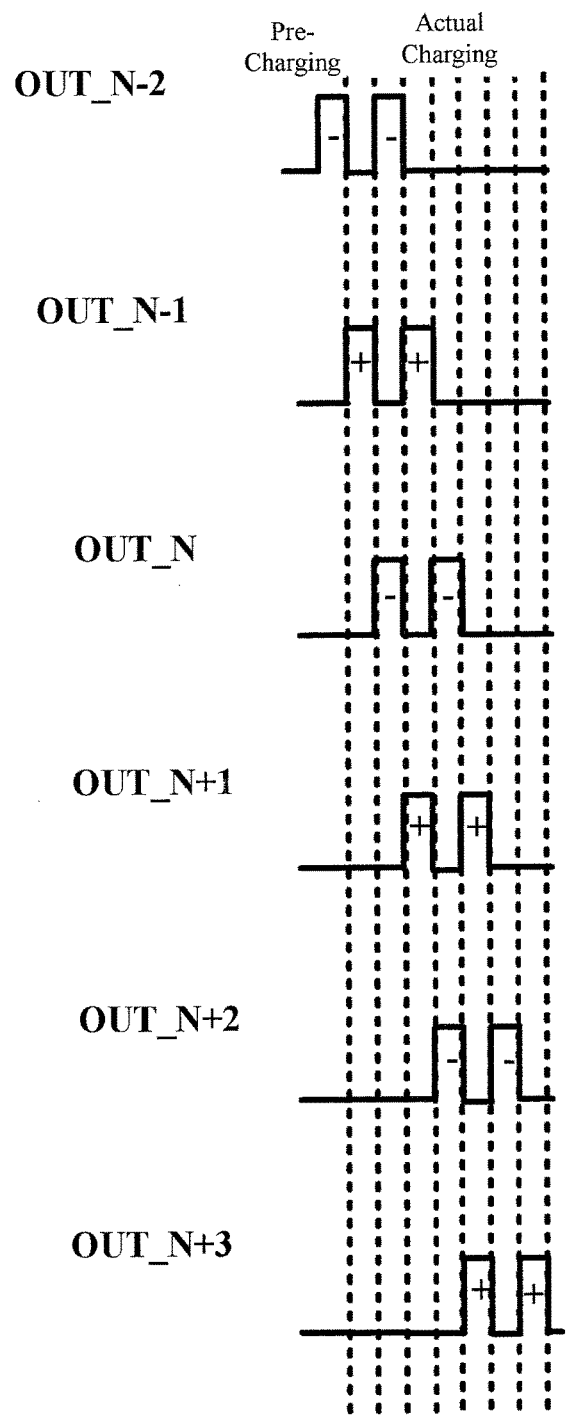
FIG. 8 is a schematic diagram showing output waveforms from the shift register units at the respective stages in the gate driving circuit shown in FIG. 7.

FIG. 8 is a schematic diagram showing output waveforms from the shift register units at the respective stages in the gate driving circuit shown in FIG. 7. As shown in FIG. 8, when the pixel units in the (N−2)-th line are actually charged with the data voltage on the data line D1, a valid level is applied onto the gate scan line GN corresponding to the pixels in the N-th line. In this case, control transistors in the pixel units are turned on and the data voltage on the data line can also pre-charge the pixels in the N-th line. The data voltage for pre-charging the pixels in the N-th line has the same polarity as the data voltage required for actually charging the pixels in the N-th line, which leads to an improved charging efficiency. Further, when the data voltage on the data line D1 is actually charging the pixel units in the (N−1)-th line, the second reset signal at the second reset signal terminal, RST_OUT N, of the shift register unit corresponding to the pixels in the N-th line is valid, such that an invalid level is applied onto the gate scan line GN corresponding to the pixels in the N-th line. At this time, the voltage having an opposite polarity to the data voltage for actual charging will not enter the pixel units, so as to guarantee the pre-charging efficiency.

Figure 9:
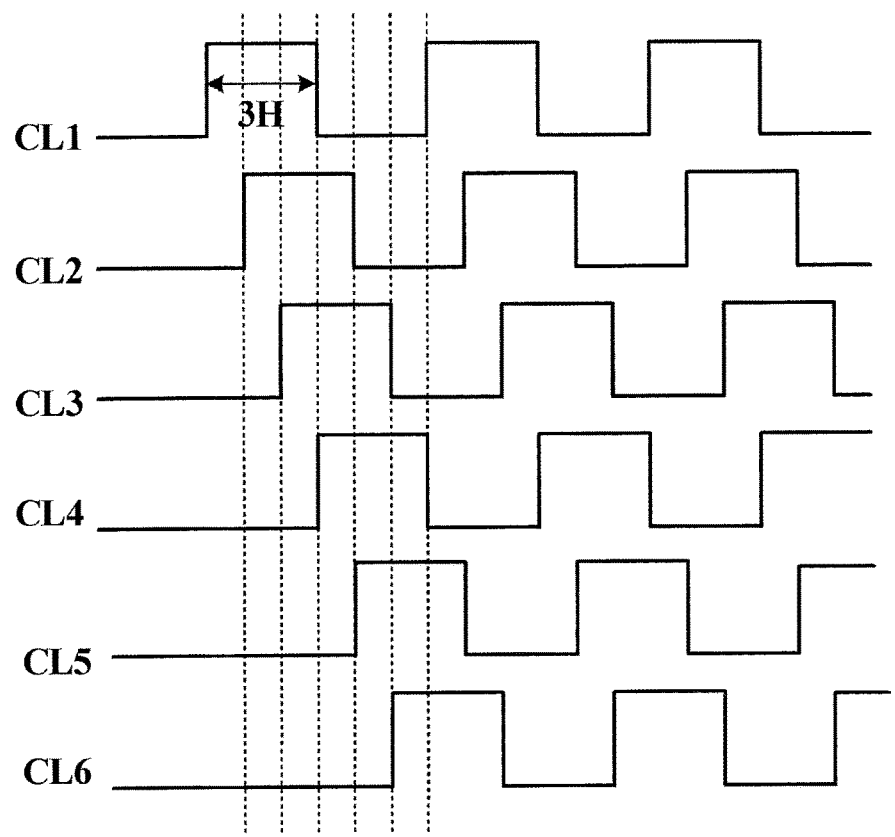
FIG. 9 is a schematic diagram of clock signals in the gate driving circuit shown in FIG. 7.

FIG. 9 is a schematic diagram of clock signals in the gate driving circuit shown in FIG. 7. The clock signals on the six clock signal lines are the same, with a difference of ⅙ period (⅙ period can also be referred to as 1H) in time from one another sequentially.

Figure 10:
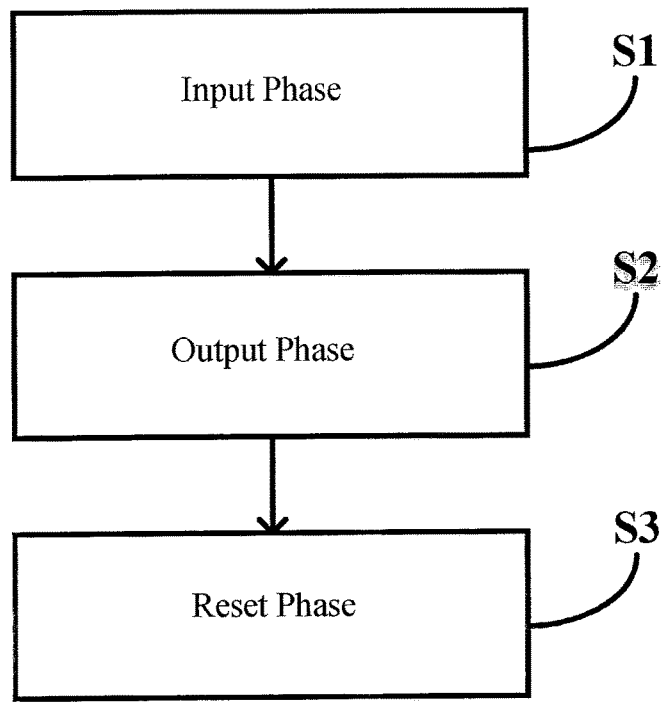
FIG. 10 is a flowchart illustrating a method for driving the gate driving circuit shown in FIG. 7.
Figure 11:
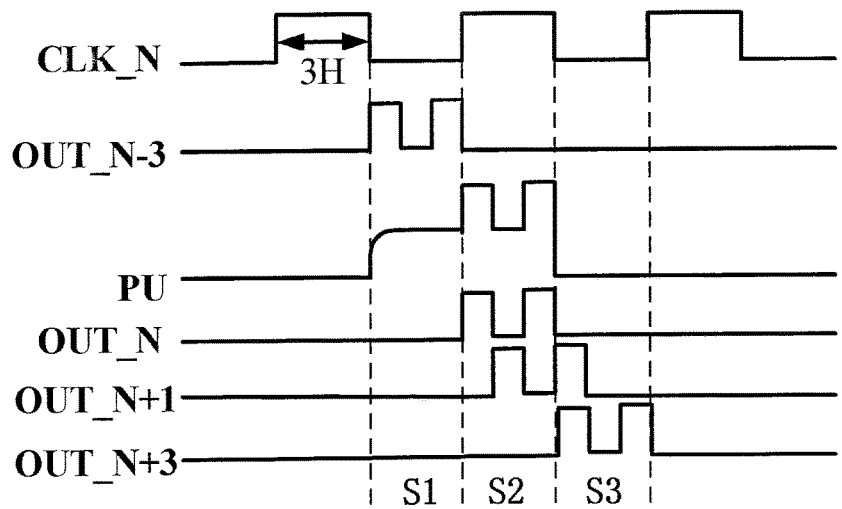
FIG. 11 is a schematic diagram of signals related to the shift register units in the gate driving circuit shown in FIG. 7.

FIG. 10 is a flowchart illustrating a method for driving the gate driving circuit shown in FIG. 7. FIG. 11 is a schematic diagram of signals related to the shift register units in the gate driving circuit shown in FIG. 7. In FIG. 11, the shift register unit at the N-th stage is taken as an example for the purpose of illustration.

The gate driving method includes an input phase S1 in which the first clock signal is invalid, the first input signal is valid and the first reset signal is invalid, such that the first input signal is stored in the first storage module. In an example where all the transistors are N-type transistors, the voltage at the clock signal terminal CLK_N is at the low level. The output, OUT_N−3, from the shift register unit at the (N−3)-th stage serves as an input signal, which is a signal switched between the high and low levels. The first storage module 4 starts storing the first pull-up signal, such that the voltage at the first pull-up node PU is pulled up.

The gate driving method further includes an output phase S2 in which the first clock signal is valid, the first input signal is invalid, the first reset signal is invalid and the second reset signal is switched between valid and invalid, such that the output signal is switched between valid and invalid. That is, the voltage at the first clock signal terminal CLK_N is at the high level. The output, OUT_N+3, from the shift register unit at the (N+3)-th stage serves as the first reset signal at the low level and the output, OUT_N+1, from the shift register unit at the (N+1)-th stage serves as the second reset signal. A duration in which the second reset signal is valid is shorter than the duration of the output phase, such that the output signal can be switched between valid and invalid.

The gate driving method further includes a reset phase S3 in which the first clock signal is invalid, the first input signal is invalid and the first reset signal is valid, such that the output signal is invalid. That is, the voltage at the first clock signal terminal CLK_N is at the low level. The output, OUT_N+3, from the shift register unit at the (N+3)-th stage serves as the first reset signal at the high level and the output, OUT_N+1, from the shift register unit at the (N+1)-th stage can still serve as the second reset signal at the high level. In this case, the first pull-up signal and the output signal are both at the low level.

Figure 12:
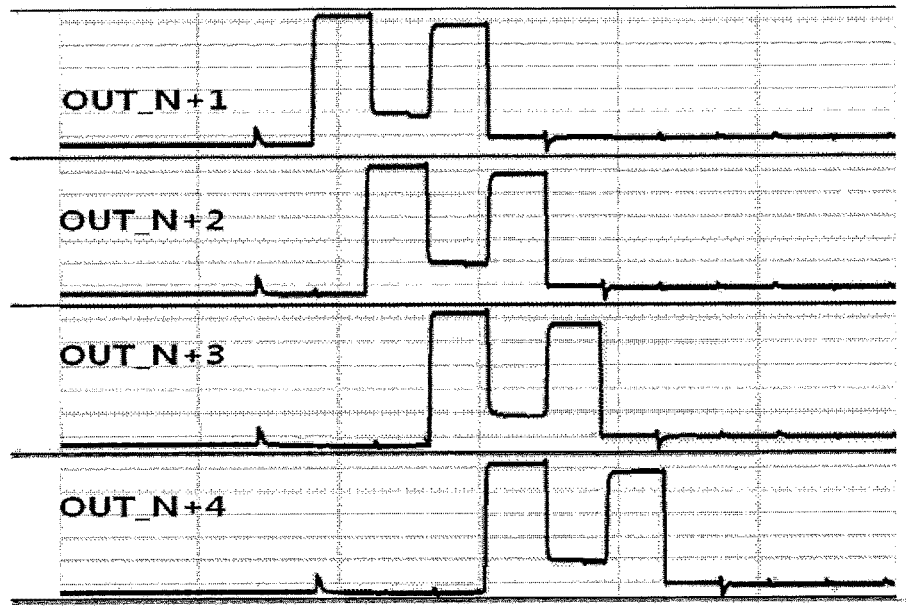
FIG. 12 is a simulation diagram of output signals from the shift register units in the gate driving circuit shown in FIG. 7.
Figure 13:
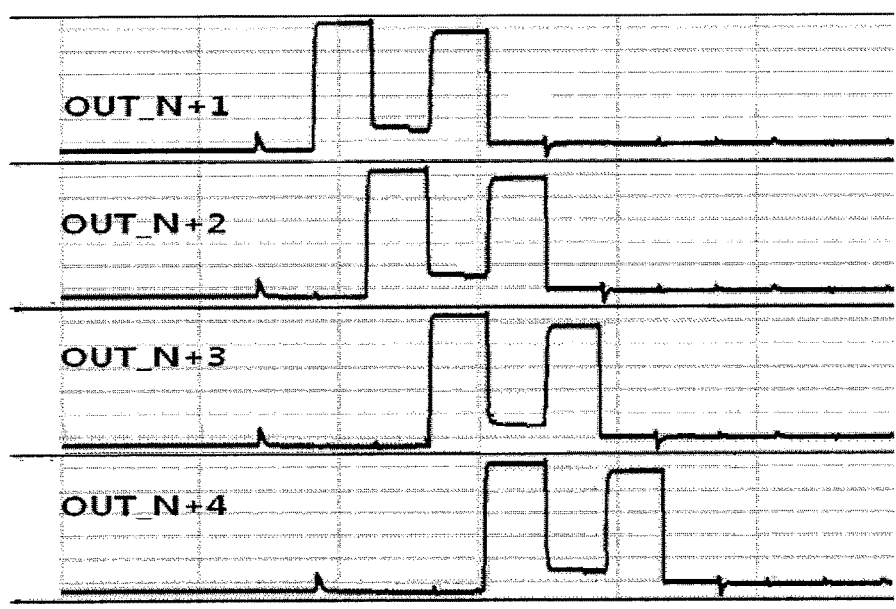
FIG. 13 is another simulation diagram of output signals from the shift register units in the gate driving circuit shown in FIG. 7.

FIG. 12 is a simulation diagram of output signals from the shift register units in the gate driving circuit shown in FIG. 7. FIG. 13 is another simulation diagram of output signals from the shift register units in the gate driving circuit shown in FIG. 7.

It can be seen from the simulation diagrams of FIGS. 12 and 13 that the gate driving circuit can function well and meet the requirements. In the output phase S2, the duration in which the second reset signal is valid is shorter than the duration of the output phase, such that the output signal can be switched between valid and invalid. When the second reset signal is valid, the fifth transistor M3R is on. At this time, as the voltage at the first pull-up node PU is still valid, the second transistor M2 is also on and still pulls up the output from the shift register unit. Meanwhile, the fifth transistor M3R pulls down the output from the shift register unit. In order to make the output from the shift register unit closer to the reset voltage, the size of the fifth transistor M3R can be larger than that of the second transistor M2, so as to enhance the pull-down effect. The size of the fifth transistor M3R can be equal to or larger than twice the size of the second transistor M2. The size of the fifth transistor M3R shown in FIG. 13 is larger than that shown in FIG. 12.

Figure 14:
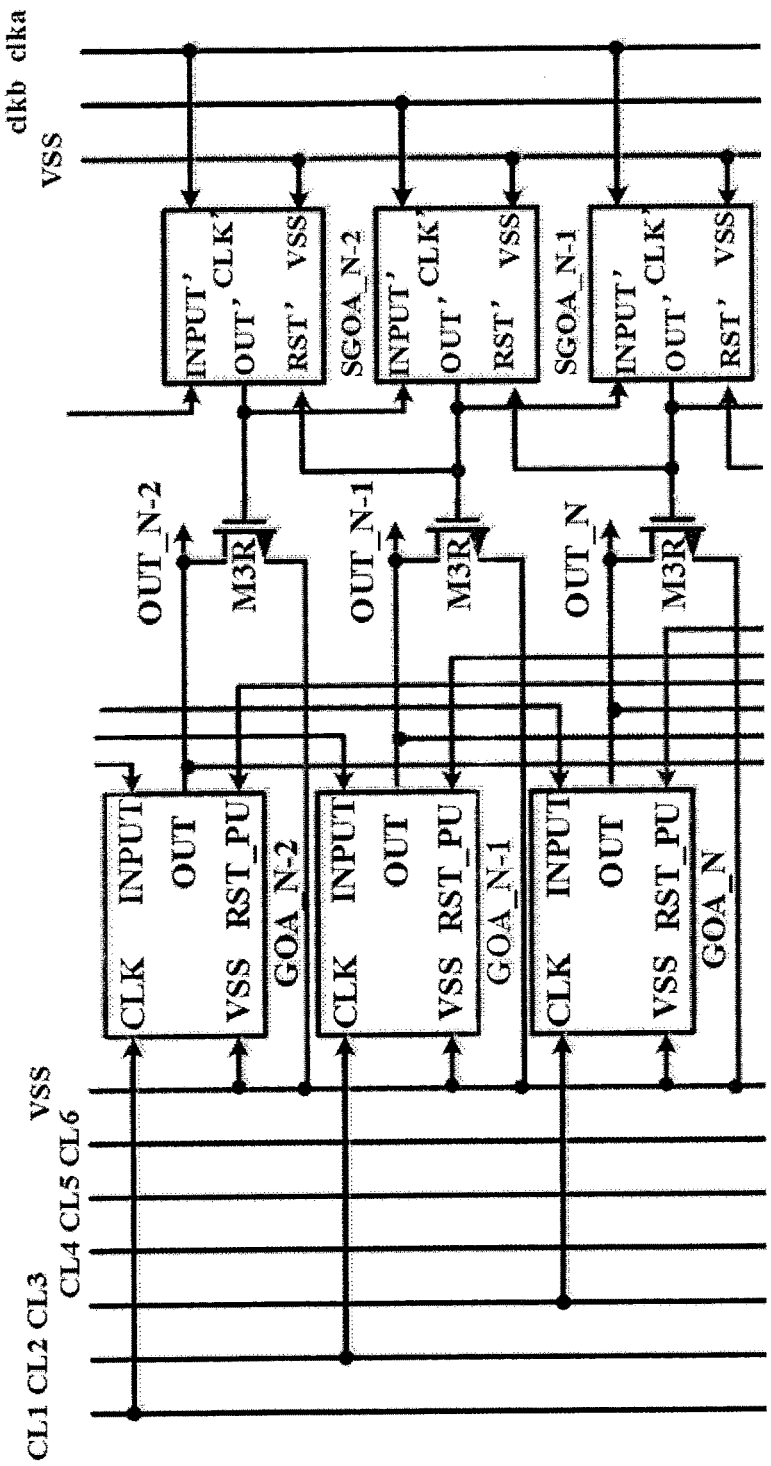
FIG. 14 is a schematic diagram of a gate driving circuit including the shift register unit shown in FIG. 6.

FIG. 14 is a schematic diagram of a gate driving circuit including the shift register unit shown in FIG. 6. As shown in FIG. 14, the gate driving circuit includes M first clock signal lines (CL1, CL2, CL3, CL4, CL5, CL6) each connected to the first clock signal terminal of one of a group of M cascaded shift register units 1 (GOA_N−2, GOA_N−1, GOA_N, GOA_N+1, GOA_N+2, GOA_N+3). The first clock signals at the M first clock signal lines are the same, with a difference of 1/M period in time from one another sequentially. The first input signal terminal INPUT of the shift register unit 1 at the N-th stage is connected to the output terminal OUT of the first output module of the shift register unit at the (N−X)-th stage. The first reset signal terminal RST_PU of the shift register unit at the N-th stage is connected to the output terminal OUT of the first output module of the shift register unit at the (N+Y)-th stage.

The second reset signal terminal RST_OUT of the shift register unit at the N-th stage is connected to the second reset signal generation module at the N-th stage. The second output module of the second reset signal generation module is connected to the second reset signal terminal RST_OUT. The gate driving circuit further includes M' second clock signal lines (clka, clkb) each connected to the second clock signal terminal of one of a group of M' cascaded second reset signal generation modules (eg., SGOA_N−2, SGOA_N−1). The second clock signals on the M' second clock signal lines are the same, with a difference of 1/M' period in time from one another sequentially. The input signal terminal of the second reset signal generation module at the N-th stage is connected to the output terminal of the second output module of the second reset signal generation module at the (N−X')-th stage. The third reset signal terminal of the second reset signal generation module at the N-th stage is connected to the output terminal of the second output module of the second reset signal generation module at the (N+Y')-th stage. The fourth reset signal terminal of the second reset signal generation module at the N-th stage is connected to the output terminal of the second output module of the second reset signal generation module at the (N+Z')-th stage. Here, the values of M', X', Y' and Z' can be adjusted depending on the timing sequence of the signals as appropriate. In general, for the purpose of timing sequence control, X'=Y'=M'/2. In FIG. 14, the third reset signal terminal and the fourth reset signal terminal connected with each other are shown at RST'. In this case, Y'=Z'.

Unlike the gate driving circuit shown in FIG. 7, the above parameters may have the following values: M=6, X=3, Y=3, M'=2, X'=1, Y'=1 and Z'=1.

Figure 15:
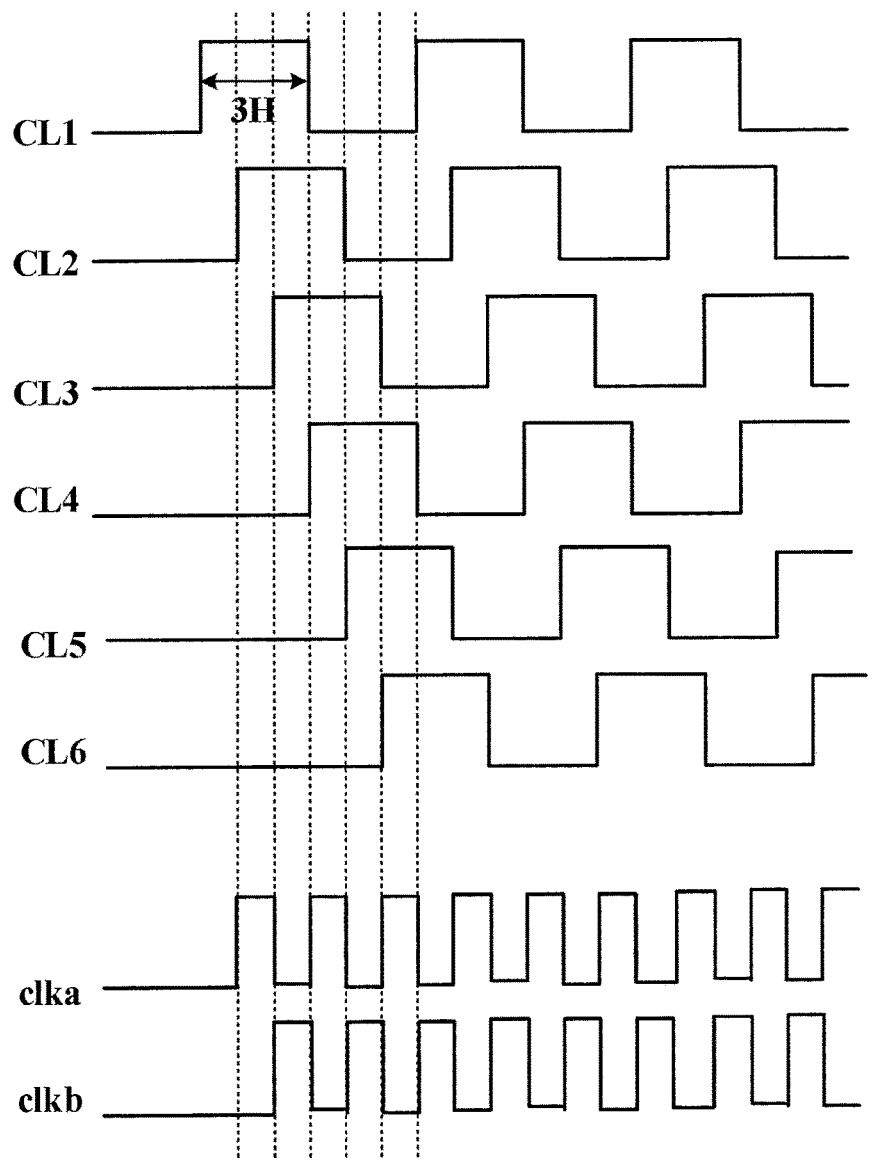
FIG. 15 is a schematic diagram of clock signals on a clock signal line and a second clock signal line.

FIG. 15 is a schematic diagram of clock signals on a clock signal line and a second clock signal line. The second clock signal on each of the M' second clock signal lines has a frequency triple that of the first clock signal on each of the M first clock signal lines.

Figure 16:
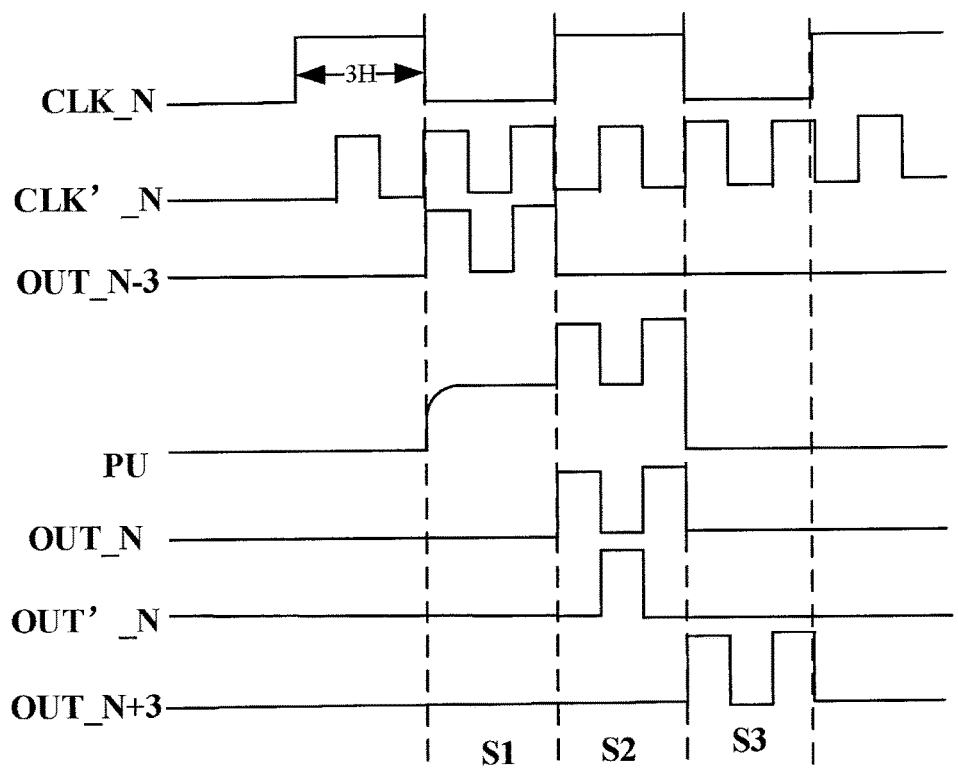
FIG. 16 is a schematic diagram of signals related to the shift register units in the gate driving circuit shown in FIG. 14.
Figure 17:
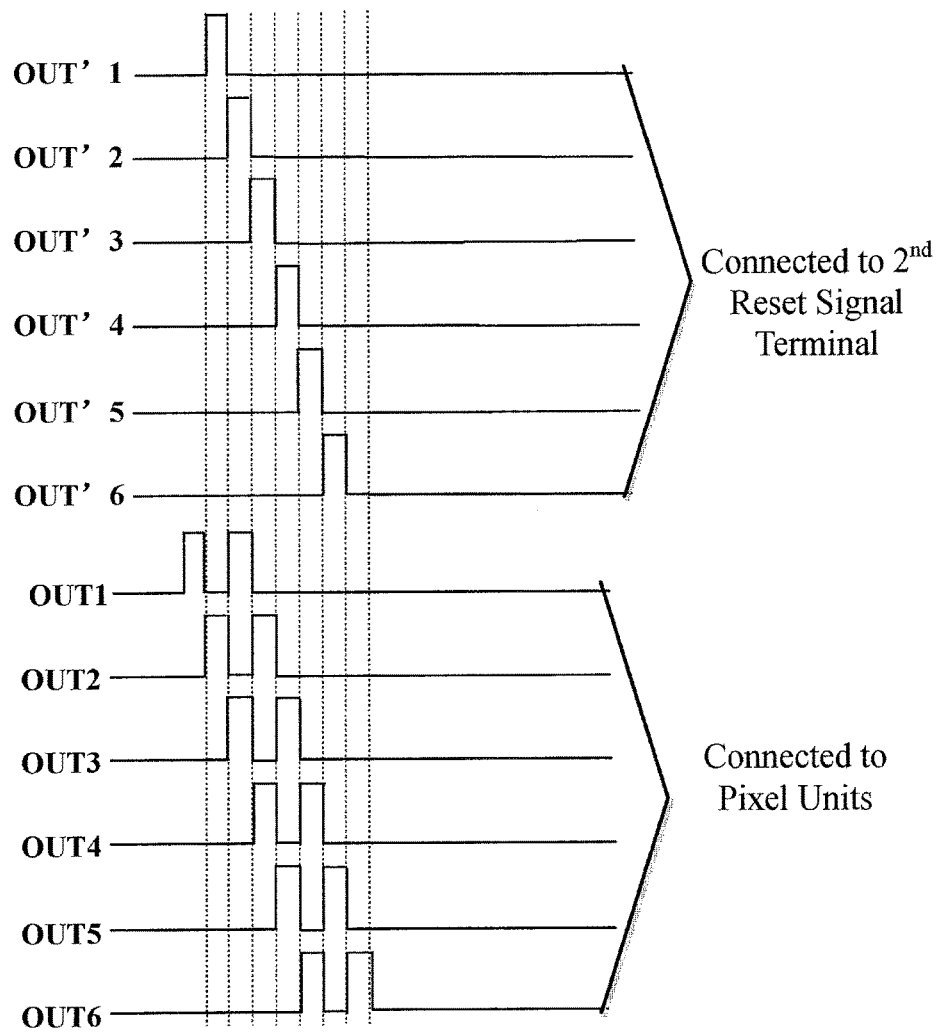
FIG. 17 is a schematic diagram of output signals from the shift register units in the gate driving circuit shown in FIG. 14.

FIG. 16 is a schematic diagram of signals related to the shift register units in the gate driving circuit shown in FIG. 14. FIG. 17 is a schematic diagram of output signals from the shift register units in the gate driving circuit shown in FIG. 14.

As shown in FIGS. 16 and 17, in an input phase S1, the first clock signal is invalid, the first input signal is valid and the first reset signal is invalid, such that the first input signal is stored in the first storage module. That is, the voltage at the clock signal terminal CLK_N is at the low level. The output, OUT_N−3, from the shift register unit at the (N−3)-th stage serves as an input signal, which is a signal switched between the high and low levels. The first storage module 4 starts storing the first pull-up signal, such that the voltage at the first pull-up node PU is pulled up.

In an output phase S2, the first clock signal is valid, the first input signal is invalid, the first reset signal is invalid and the second reset signal is switched between valid and invalid, such that the output signal is switched between valid and invalid. That is, the voltage at the first clock signal terminal CLK_N is at the high level. The output, OUT_N+3, from the shift register unit at the (N+3)-th stage serves as the first reset signal at the low level and the output, OUT_N+1, from the shift register unit at the (N+1)-th stage serves as the second reset signal. A duration in which the second reset signal is valid is shorter than the duration of the output phase, such that the output signal can be switched between valid and invalid.

In a reset phase S3, the first clock signal is invalid, the first input signal is invalid and the first reset signal is valid, such that the output signal is invalid. That is, the voltage at the clock signal terminal CLK_N is at the low level. The output, OUT_N+3, from the shift register unit at the (N+3)-th stage serves as the first reset signal at the high level. In this case, the first pull-up signal and the output signal are both at the low level.

Figure 18:
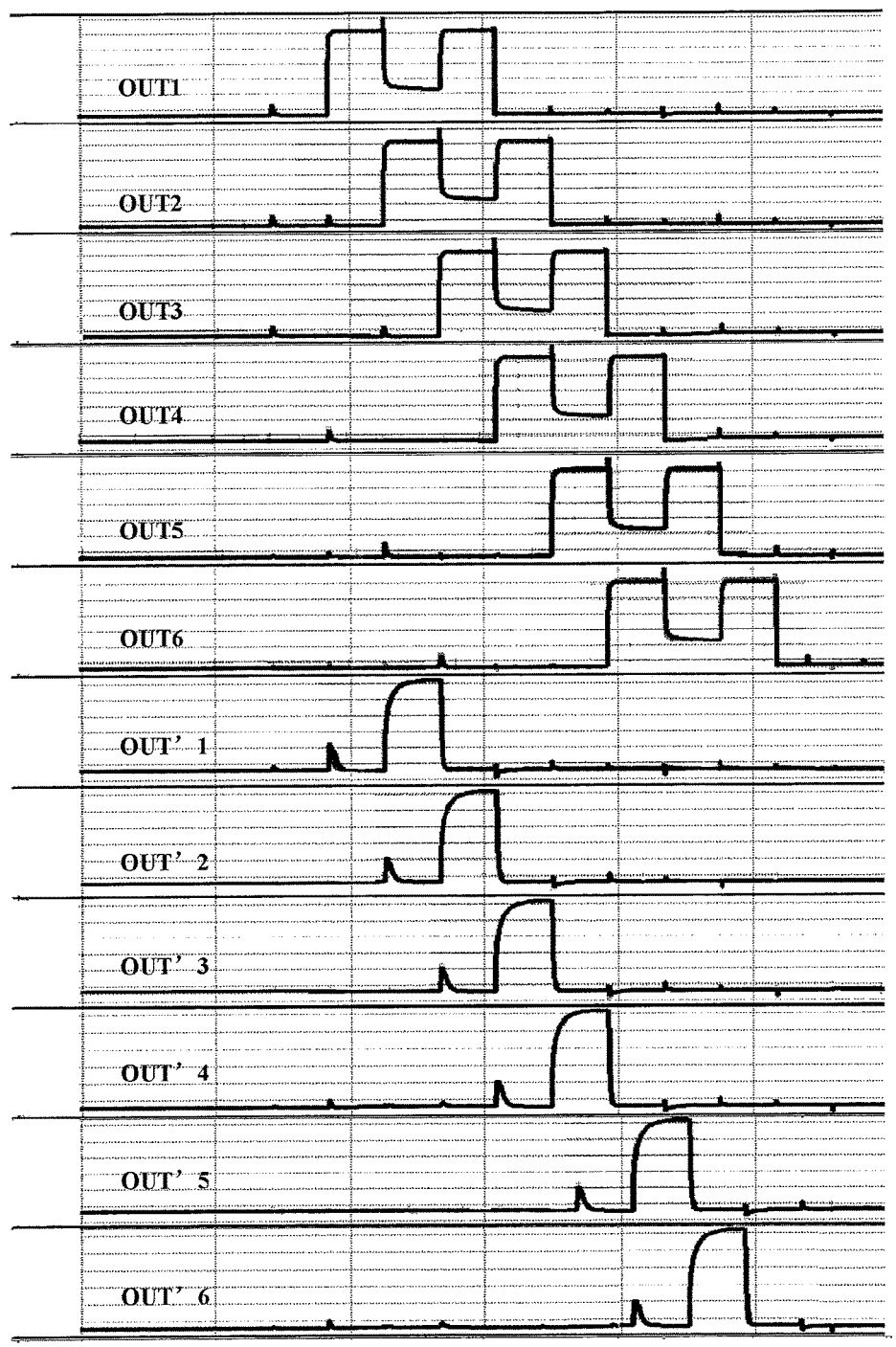
FIG. 18 is a simulation diagram of output signals from the shift register units in the gate driving circuit shown in FIG. 14.

FIG. 18 is a simulation diagram of output signals from the shift register units in the gate driving circuit shown in FIG. 14. It can be seen from the simulation diagram of FIG. 18 that the gate driving circuit can function well and meet the requirements.

In the gate driving circuit in FIG. 14, the output from the second reset signal generation module can be turned off or can be adjusted based on different second clock signals. In this way, the gate driving circuit may have wider application. For example, when the inversion driving scheme is not used, a constant low level can be applied to the second clock signal lines, clka and clkb, such that the output from the second reset signal generation module will be constantly low.

Therefore, the gate driving circuit can also be applied to a display apparatus having variable driving modes. The characteristics of the second reset signal can be changed in real time based on the current driving mode of the display apparatus. Further, more second reset signal generation modules or modules having the same function can be provided in the shift register at one stage, so as to control the second reset signal more accurately.

According to an embodiment of the present disclosure, a display apparatus is provided. The display apparatus includes the above gate driving circuit. The display apparatus can be a mobile phone, a tablet computer, a television, a display, a laptop computer, a digital frame, a navigator or any product or component having a display function.

It is to be noted that, in the above description, any reference to "high level" or "low level" only means whether a voltage can turn on a transistor, but is not limited to any specific voltage value. For example, a low level can be a ground level or a negative level. Moreover, while the above embodiments have been described assuming all transistors to be N-type transistors, the present disclosure is not limited to any specific type of transistors. Those skilled in the art can select or change the type of the transistors without departing from the principle of the present disclosure. Such selections and changes are to be encompassed by the scope of the present disclosure.

It can be appreciated that the above embodiments are exemplary only, for illustrating the principles of the present disclosure. However, the present disclosure is not limited to those embodiments. A number of variants and modifications can be made by those skilled in the art without departing from the spirit and scope of the present disclosure. These variants and modifications are to be encompassed by the scope of the present disclosure.

What is claimed is:

1. A shift register unit, comprising:
a first input module connected to a first input signal terminal and a first output module and configured to output a first pull-up signal to the first output module based on a first input signal;
the first output module connected to a first clock signal terminal and configured to output an output signal based on the first pull-up signal and a first clock signal;
a first storage module connected to the first input module and the first output module and configured to store the first pull-up signal;
a first reset module connected to a first reset signal terminal and the first storage module and configured to reset the first storage module based on a first reset signal; and
a second reset module connected to a second reset signal terminal and the first output module and configured to reset the output from the first output module based on a second reset signal,
wherein the first clock signal is invalid when the first input signal is valid, and wherein the second reset signal is set to be valid while the first pull-up signal and the first clock signal are valid and a duration in which the second reset signal is valid is shorter than a duration in which the first clock signal is valid.

2. The shift register unit of claim 1, wherein
the second reset module comprises a fifth transistor having a first electrode connected to a reset voltage terminal, a second electrode connected to an output terminal of the first output module, and a control electrode connected to the second reset signal terminal.

3. The shift register unit of claim 2, further comprising a second reset signal generation module, wherein
the second reset signal terminal is connected to the second reset signal generation module, and
the second reset signal generation module comprises:
a second input module connected to a second input signal terminal and a second output module and configured to output a second pull-up signal to the second output module based on a second input signal;
the second output module connected to a second clock signal terminal and the second reset signal terminal and configured to output a second reset signal based on the second pull-up signal and a second clock signal;
a second storage module connected to the second input module and the second output module and configured to store the second pull-up signal;
a third reset module connected to a third reset signal terminal and the second storage module and configured to reset the second storage module based on a third reset signal; and
a fourth reset module connected to a fourth reset signal terminal and the second output module and configured to reset the output from the second output module based on a fourth reset signal.

4. The shift register unit of claim 3, wherein the third reset signal terminal is connected to the fourth reset signal terminal.

5. The shift register unit of claim 2, wherein the second reset module further comprises a fourth transistor having a first electrode connected to the reset voltage terminal, a second electrode connected to the output terminal of the first output module, and a control electrode connected to the first reset signal terminal.

6. The shift register unit of claim 3, wherein the second reset module further comprises a fourth transistor having a first electrode connected to the reset voltage terminal, a second electrode connected to the output terminal of the first output module, and a control electrode connected to the first reset signal terminal.

7. The shift register unit of claim 1, wherein
the first input module comprises a first transistor having a control electrode and a first electrode connected to the first input signal terminal and a second electrode connected to the first output module,
the first output module comprises a second transistor having a control electrode connected to the first input module, a first electrode connected to the first clock signal terminal and a second electrode connected to an output terminal of the first output terminal,
the first storage module comprises a first capacitor having a first terminal connected to the control electrode of the second transistor and a second terminal connected to the second electrode of the second transistor, and
the first reset module comprises a third transistor having a control electrode connected to the first reset signal terminal, a first electrode connected to a reset voltage terminal and a second electrode connected to the first terminal of the first capacitor.

8. The shift register unit of claim 3, wherein
the second input module comprises a sixth transistor having a control electrode and a first electrode connected to the second input signal terminal and a second electrode connected to the second output module,
the second output module comprises a seventh transistor having a control electrode connected to the second input module, a first electrode connected to the second clock signal terminal and a second electrode connected to the second reset signal terminal,
the second storage module comprises a second capacitor having a first terminal connected to the control electrode of the seventh transistor and a second terminal connected to the second electrode of the seventh transistor,
the third reset module comprises an eighth transistor having a control electrode connected to the third reset signal terminal, a first electrode connected to the reset voltage terminal and a second electrode connected to the first terminal of the second capacitor, and
the fourth reset module comprises a ninth transistor having a control electrode connected to the fourth reset signal terminal, a first electrode connected to the reset voltage terminal and a second electrode connected to the second terminal of the second capacitor.

9. The shift register unit of claim 8, wherein the second reset module further comprises a fourth transistor having a first electrode connected to the reset voltage terminal, a second electrode connected to the output terminal of the first output module, and a control electrode connected to the first reset signal terminal.

10. A gate driving circuit, comprises a plurality of cascaded shift register units according to claim 1, wherein the gate driving circuit comprises M first clock signal lines each connected to the first clock signal terminal of one of a group of M cascaded shift register units, the first clock signals on the M first clock signal lines are the same, with a difference of 1/M period in time from one another sequentially, the first input signal terminal of the shift register unit at the N-th stage is connected to the output terminal of the first output module of the shift register unit at the (N−X)-th stage, and the first reset signal terminal of the shift register unit at the N-th stage is connected to the output terminal of the first output module of the shift register unit at the (N+Y)-th stage, where X=Y=M/2 and X, Y and M are all positive integers.

11. The gate driving circuit of claim 10, wherein each second reset module comprises a fifth transistor having a first electrode connected to a reset voltage terminal, a second electrode connected to the output terminal of the first output module, and a control electrode connected to the second reset signal terminal.

12. The gate driving circuit of claim 11, wherein the second reset signal terminal of the shift register unit at the N-th stage is connected to the output terminal of the first output module of the shift register unit at the (N+Z)-th stage.

13. The gate driving circuit of claim 12, wherein M=6, X=3, Y=3 and Z=1.

14. The gate driving circuit of claim 13, wherein each shift register unit further comprises a second reset signal generation module, wherein the second reset signal generation module comprises:
a second input module connected to a second input signal terminal and a second output module and configured to output a second pull-up signal to the second output module based on a second input signal;
the second output module connected to a second clock signal terminal and the second reset signal terminal and configured to output a second reset signal based on the second pull-up signal and a second clock signal;
a second storage module connected to the second input module and the second output module and configured to store the second pull-up signal;
a third reset module connected to a third reset signal terminal and the second storage module and configured to reset the second storage module based on a third reset signal; and
a fourth reset module connected to a fourth reset signal terminal and the second output module and configured to reset the output from the second output module based on a fourth reset signal, and
wherein the gate driving circuit further comprises M' second clock signal lines each connected to the second clock signal terminal of one of a group of M' cascaded second reset signal generation modules, the second clock signals on the M' second clock signal lines are the same, with a difference of 1/M' period in time from one another sequentially, the second input signal terminal of the second reset signal generation module at the N-th stage is connected to the output terminal of the second output module of the second reset signal generation module at the (N−X')-th stage, the third reset signal terminal of the second reset signal generation module at the N-th stage is connected to the output terminal of the second output module of the second reset signal generation module at the (N+Y')-th stage, and the fourth reset signal terminal of the second reset signal generation module at the N-th stage is connected to the output terminal of the second output module of the second reset signal generation module at the (N+Z')-th stage.

15. The gate driving circuit of claim 14, wherein M=6, X=3, Y=3, M'=2, X'=1, Y'=1 and Z'=1, wherein the second clock signal on each of the M' second clock signal lines has a frequency triple that of the first clock signal on each of the M first clock signal lines.

16. The gate driving circuit of claim 11, wherein each second reset module further comprises a fourth transistor having a first electrode connected to the reset voltage terminal, a second electrode connected to the output terminal of the first output module, and a control electrode connected to the first reset signal terminal.

17. The gate driving circuit of claim 14, wherein each second reset module further comprises a fourth transistor having a first electrode connected to the reset voltage terminal, a second electrode connected to the output terminal of the first output module, and a control electrode connected to the first reset signal terminal.

18. A method for driving the shift register unit according to claim 1, comprising:
    an input phase in which the first clock signal is invalid, the first input signal is valid and the first reset signal is invalid, such that the first input signal is stored in the first storage module;
    an output phase in which the first clock signal is valid, the first input signal is invalid, the first reset signal is invalid and the second reset signal is valid, a duration in which the second reset signal is valid being shorter than a duration in which the first clock signal is valid; and
    a reset phase in which the first clock signal is invalid, the first input signal is invalid and the first reset signal is valid, such that the output signal is invalid.

19. An array substrate, comprising the gate driving circuit according to claim 10.

20. A display apparatus, comprising the array substrate according to claim 19.

* * * * *